: 
United States Patent [19]

Morita

[11] Patent Number: 5,571,776
[45] Date of Patent: Nov. 5, 1996

[54] SINGLE CRYSTALLINE BULK OXIDE SUPERCONDUCTOR AND PROCESS FOR PRODUCING SAME

[75] Inventor: Mitsuru Morita, Kawasaki, Japan

[73] Assignee: Nippon Steel Corporation, Tokyo, Japan

[21] Appl. No.: 995,643

[22] Filed: Dec. 18, 1992

[30] Foreign Application Priority Data

Dec. 20, 1991 [JP] Japan ............................ 3-354469

[51] Int. Cl.$^6$ ................ H01B 12/00; C04B 35/505; H01L 39/12
[52] U.S. Cl. .................... 505/126; 505/234; 505/780; 505/785; 505/781; 252/521; 428/54; 428/212; 428/688; 117/78; 117/944
[58] Field of Search ................ 505/785, 781, 505/729, 451, 234, 126; 252/518, 521; 428/54, 212, 688; 117/78, 944

[56] References Cited

U.S. PATENT DOCUMENTS 5,084,436  1/1992  Morimoto .................... 505/1

FOREIGN PATENT DOCUMENTS

| 0374263 | 6/1990 | European Pat. Off. ........ 505/1 |
| 0486698 | 5/1992 | European Pat. Off. . | |
| 0493007 | 7/1992 | European Pat. Off. . | |
| 0164731 | 6/1989 | Japan ........................ 505/781 |
| WO-A-9119029 | 12/1991 | Japan . | |
| WO91/19029 | 12/1991 | WIPO . | |

OTHER PUBLICATIONS

Morita "Quench and Melt Growth (QMG) process for . . . " *Advances in Superconductivity III* ISS '90 proceedings, Nov. 6–9, 1990; pp . 733–736.
M. Morita et al. "Quench and Melt Growth (QMG) Process for Large Bulk Superconductor Fabrication", Advances in Superconductivity III, Springer–Verlag, Tokyo, 1990, pp. 733–736.

*Primary Examiner*—Paul Lieberman
*Assistant Examiner*—M. Kopec
*Attorney, Agent, or Firm*—Kenyon & Kenyon

[57] ABSTRACT

Enlargement of a crystal of a bulk oxide superconductor of $REBa_2Cu_3O_{7-x}$, wherein RE is at least one of Y and rare earth elements, is effected by three dimensionally arranging layers of $REBa_2Cu_3O_{7-x}$ with a different RE in the order of decreasing (123) phase formation temperatures from the center outward, or by forming a stack of layers of $RE Ba_2 Cu_3 O_{7-x}$ with a different RE in the order of decreasing (123) phase formation temperatures; the size of the layer being enlarged along with a decrease in the (123) phase formation temperature.

8 Claims, 5 Drawing Sheets

5μm

5μm

SINGLE CRYSTALLINE BULK OXIDE SUPERCONDUCTOR AND PROCESS FOR PRODUCING SAME

BACKGROUND OF THE INVENTION

1. Field of the Invention

The present invention relates to a bulk superconductor comprising a superconductive $REBa_2Cu_3O_{7-x}$ phase.

2. Description of the Related Art

At the present, enlargement of a crystal of $REBa_2Cu_3O_{7-x}$ (123 phase type) superconductor is sought after. Here, RE represents Y or rare earth element. Such enlargement of a crystal should be made in a single crystal of the (123) phase since a polycrystalline structure involves crystal grain boundaries between (123) phases that weaken the bonds between the crystals thereby deteriorating the superconductor properties.

It has been proposed to prepare a stack of layers comprising different complex oxides of RE, Ba and Cu that are arranged such that (123) phase formation temperatures thereof are successively lowered using the repetitive quench method or by the repetitive pressing of starting oxide powder mixtures, followed by heating the stack to a partial melt state, seeding the stack with a seed crystal and then unidirectionally crystallizing the stack of layers utilizing the difference in the (123) phase formation temperature (*Advances in Superconductivity* III, Springier-Verlag. Tokyo, 1990, pp 733–736).

In the above proposal, the arrangement of layers is made to provide a uniaxial gradient of (123) phase formation temperature (Tf) by the composition difference, particularly RE, of the starting materials. In this case, a seed crystal is disposed at the center of a top layer of the stack and, for example, the edges or periphery of the top layer, remote from the seed crystal, tend to be nucleated, which results in the formation of a polycrystal of the (1,2,3) phase.

The object of the present invention is to solve the above problem and to provide a bulk $REBa_2Cu_3O_{7-x}$ superconductor in the form of a single crystal of the between (123) phase wherein precipitates of a (211) phase are dispersed.

SUMMARY OF THE INVENTION

According to the present invention, there is provided a bulk oxide superconductor in the form of a single crystal of a complex oxide of RE, Ba and Cu where RE represents at least one element of the group consisting of Y, Sm, Eu, Gd, Dy, Ho, Er, Tm, Yb and Lu; said single crystal having a structure of a single crystalline $REBa_2Cu_3O_{7-x}$ (123) phase in which $RE_2BaCuO_5$ (211) phases are finely dispersed; said single crystal being composed of three dimensional layers from the center portion outward; each of said layers comprising a RE element or a composition of RE elements different from those of the other layers; said layers being located such that the (123) phase formation temperatures of said layers are successively lowered from the center portion outward.

There is also provided a bulk oxide superconductor in the form of a single crystal of a complex oxide of RE, Ba and Cu, where RE represents at least one element of the group consisting of Y, Sm, Eu, Gd, Dy, Ho, Er, Tm, Yb and Lu; said single crystal having a structure of a single crystalline $REBa_2Cu_3O_{7-x}$ phase in which $RE_2BaCuO_5$ phases are finely dispersed; said single crystal being composed of a stack of layers; each of said layers comprising a RE element or a composition of RE elements different from those of the other layers; said layers having respective (123) phase formation temperatures that are successively lowered in the direction of said stack; said layers having respective layer sizes in a direction perpendicular to said stack, which sizes are successively elongated as the (123) phase formation temperature of the layers are lowered.

It is preferred that the (211) phase are present in an amount of not more than 50% by volume of the total oxide phases, (123) and (211) phases, and not less than 95%, in number of particles, of the (211) phases having a particle size of not more than 20 µm, more preferably not more than 2 µm.

There is further provided a process for producing a bulk oxide superconductor, comprising preparing a plurality of starting materials having a composition of a (RE:Ba:Cu) ratio in a region enclosed by linear lines connecting (30:33:37), (15:38:47), (15:30:55) and (30:25:45) and further containing at least one of 0.001–2.0% by weight of Rh and 0.05–5.0% by weight of Pt; said plurality of starting materials having different compositions of RE, Ba and Cu, wherein RE represents at least one element of the group consisting of Y, Sm, Eu, Gd, Dy, Ho, Er, Tm, Yb and Lu, forming said starting materials into an intermediate shaped body (M) composed of three dimensionally arranged layers from the center portion outward; said layers having respective compositions such that (123) phase formation temperatures (Tf) thereof are successively lowered from the center portion outward, forming a second shaped body (H) of a starting material having a (123) phase formation temperature (Tf) higher than any of said (123) phase formation temperatures of said layers of the intermediate shaped body (M), forming a third shaped body (L) of a starting material having a (123) phase formation temperature (Tf) lower than any of said (123) phase formation temperatures of said layers of the intermediate shaped body (M), forming an assembly of said intermediate shaped body (M) / said second shaped body (L) / said first shaped body (H) / a support in this order, heating said assembly to a temperature at which (211) phases and liquid phases coexist in said intermediate shaped body (M), cooling said assembly to a temperature lower than a (123) phase formation temperature (Tf) of a seed to be used and higher than any of said (123) phase formation temperatures of said intermediate shaped body (M), then seeding said assembly with a seed crystal, gradually cooling said assembly with said seed crystal to a temperature lower than any of said (123) phase formation temperatures (TF) of said intermediate shaped body (M) by at least 30° C. at a cooling rate of not more than 20° C./hr to grow a crystal of the (123) phase wherein precipitates of a (211) phase are dispersed, and treating said crystal in an oxidizing atmosphere at a temperature range of 800° C. to 200° C. to add oxygen to said crystal and to obtain a bulk oxide superconductor of $REBa_2Cu_3O_{7-x}$.

There is also provided a process for producing a bulk oxide superconductor, comprising preparing a plurality of starting materials having a composition of a RE:Ba:Cu ratio in a region enclosed by linear lines connecting (30:33:37), (15:38:47), (15:30:55) and (30:25:45) and further containing at least one of 0.001–2.0% by weight of Rh and 0.05–5.0% by weight of Pt; said plurality of starting materials having different compositions of RE, Ba and Cu, wherein RE represents at least one element of the group consisting of Y, Sm, Eu, Gd, Dy, Ho, Er, Tm, Yb and Lu, forming said starting materials into an intermediate shaped body (M') composed of a stack of layers having respective compositions and sizes in a direction perpendicular to said stack such that in a direction of said stack, (123) phase formation temperatures (Tf) of said layers are successively lowered and said sizes of said layers are successively elongated, forming a second shaped body (H) of a starting material having a (123) phase formation temperature (Tf) higher than any of said (123) phase formation temperatures of said layers of the intermediate shaped body (M'), forming a third shaped body (L) of a starting material having a (123) phase formation temperature (Hf) lower than any of said (123) phase formation temperatures of said layers of the intermediate shaped body (M'), forming an assembly of said intermediate shaped body (M') / said second shaped body (L) / said first shaped body (H) / a support in this order, heating said assembly to a temperature at which (211) phases and liquid phases coexist in said intermediate shaped body (M'), cooling said assembly to a temperature lower than a (123) phase formation temperature (Tf) of a seed to be used and higher than any of said (123) phase formation temperatures of said intermediate shaped body (M'), then seeding said assembly with a seed crystal, gradually cooling said assembly with said seed crystal to a temperature lower than any of said (123) phase formation temperatures (Tf) of said intermediate shaped body (M') by at least 30° C. at a cooling rate of not more than 20° C./hr to grow a crystal of the (123) phase wherein precipitates of a (211) phase are dispersed, and treating said crystal in an oxidizing atmosphere at a temperature range of 800° C. to 200° C. to add oxygen to said crystal and to obtain a bulk oxide superconductor of $REBa_2Cu_3O_{7-x}$.

DESCRIPTION OF PREFERRED EMBODIMENTS

Figure 1:
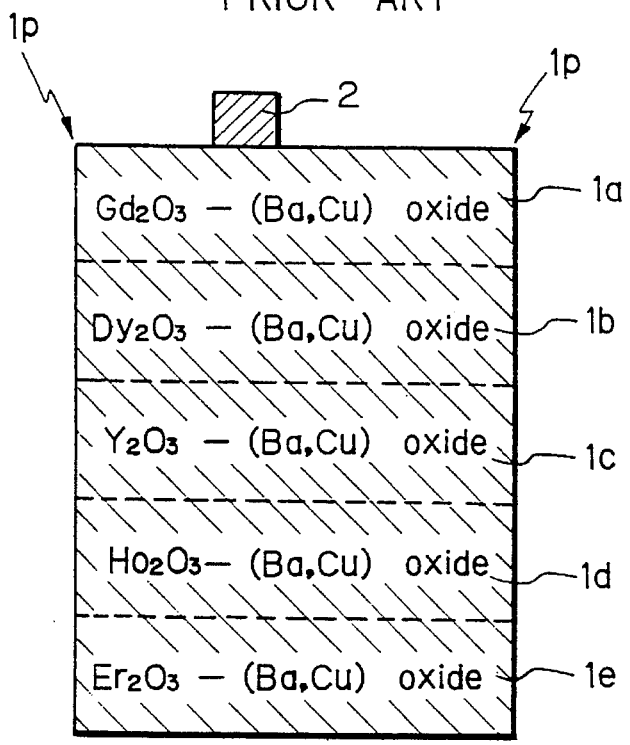
FIG. 1 shows a formation of a bulk oxide superconductor in the prior art.

Before describing the present invention, the prior art is described with reference to the drawing. FIG. 1 shows a stack 1 of layers 1a to 1e of starting materials comprising a rare earth element oxide and oxides or a complex oxide of Ba and Cu. As shown in FIG. 1, the rare earth elements of the starting materials of the layers 1a to 1e vary successively such that the (123) phase formation temperatures of the layers are successively lowered from the top 1a to the bottom 1e. A seed crystal 2 is placed on the top layer 1a at the center thereof. For example, the layers 1a to 1e have a diameter of 50 mm and a thickness of 10 mm. The stack is heated to a temperature higher than the (123) phase formation temperature of the top layer 1a and lower than that of the seed crystal 2 and then gradually cooled to seed and crystallize unidirectionally from the top layer 1a to the bottom layer 1e. Thus a layer bulk $Re Ba_2 Cu_3 O_{7-x}$ crystal can be obtained.

Nevertheless, since the periphery 1p of the top layer 1a is far from the seed 2, nucleation also occurs at the periphery 1p of the top layer 1a to thereby makes the resultant crystal polycrystalline.

In the present invention, the above problem is removed by arranging layers of starting materials three dimensionally from the center outward (first embodiment) or by making a stack of layers of starting materials having successively elongated layers concurrent with a lowering of the (123) phase formation temperature (second embodiment), and an enlarged single crystal of a $REBa_2Cu_3O_{7-x}$ superconductor where precipitates of a (211) phase are dispersed can be obtained.

Figure 2:
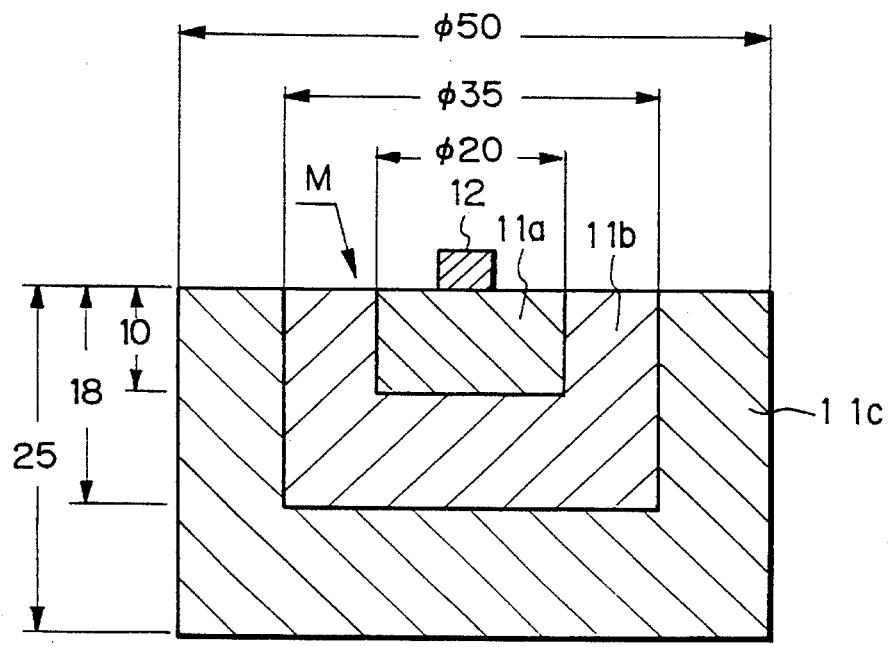
FIGS. 2 and 3 show the structures of bulk oxide superconductors according to the first embodiment of the present invention.
Figure 3:
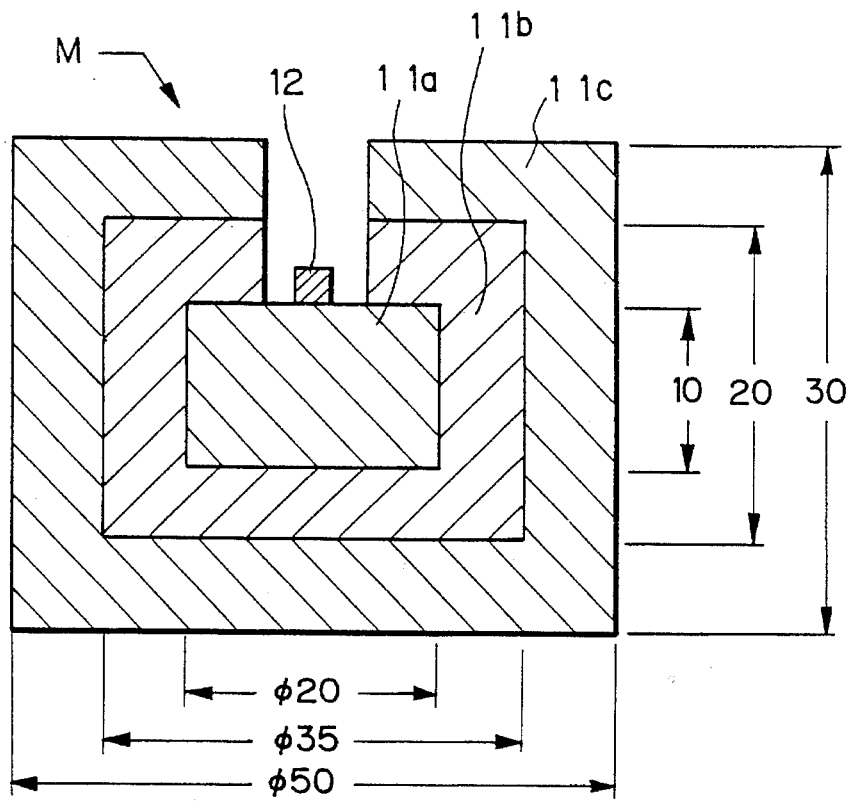

FIGS. 2 and 3 illustrate the first embodiment, i.e., the layers of starting materials are three dimensionally arranged from the center outward. From the center layer 11a to the intermediate layer 11b to the outermost layer 11c, the (123) phase formation temperatures thereof are successively lowered. Since the center layer 11a has a small surface area, excluding the area at which a seed 12 is disposed, nucleation on the surface of the layer 11a, other than the seed, is prevented and an excellent single crystal of the (123) phase where precipitates of a (211) phase are dispersed can be obtained.

In FIG. 2, the center layer 11a has a diameter of 20 mm and a height of 10 mm; the intermediate layer 11b has an outer diameter of 35 mm and a height of 18 mm and the outermost layer 11c has an outer diameter of 50 mm and a height of 25 mm.

In FIG. 3, the center layer 11a has a diameter of 20 mm and a height of 10 mm; the intermediate layer 11b has an outer diameter of 35 mm and a height of 20 mm, and the outermost layer 11c has a diameter of 50 mm and a height of 30 mm.

Figure 4:
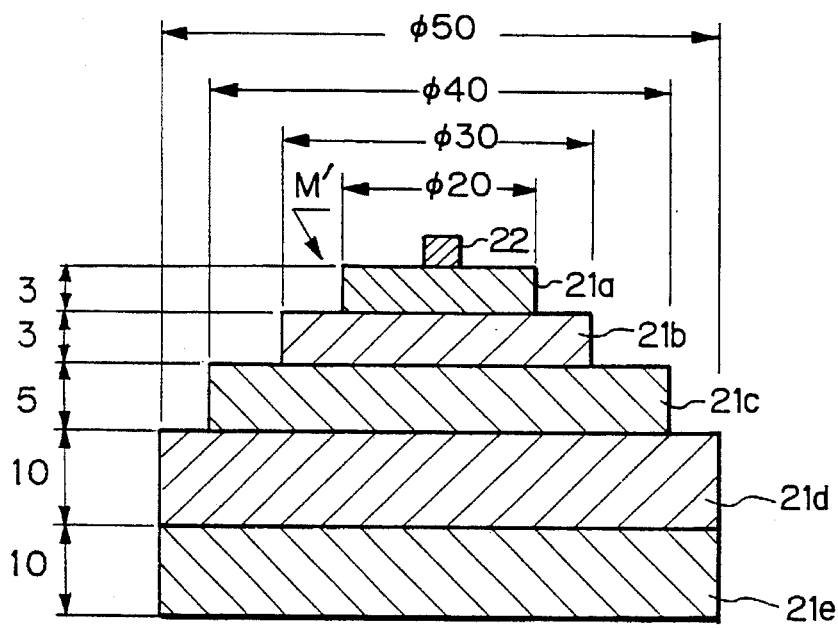
FIG. 4 shows the structure of a bulk oxide superconductor according to the second embodiment of the present invention.

FIG. 4 illustrates the second embodiment of the present invention, i.e., the layers of starting materials are stacked such that the (123) phase formation temperatures of the layers are successively lowered and the sizes or lengths of the layers perpendicular to the stack, i.e., in the direction of the main surfaces of the layers, are successively elongated in the direction of the stack.

In FIG. 4, the (123) phase formation temperature is lowered from the top layer 21a to the lower layer 21e and the size or length of the layer is elongated from the top layer 21a to the lower layer 21e, provided that the size or length of the layer 21d is the same as that of the layer 21e. The top layer 21a has a diameter of 20 mm and a thickness of 3 mm; the second layer 21b has a diameter of 30 mm and a thickness of 3 mm; the third layer 21c has a diameter of 40 mm and a thickness of 5 mm; the fourth layer 21d has a diameter of 50 mm and a thickness of 10 mm, and the fifth layer 21e has a diameter of 50 mm and a thickness of 10 mm. A seed crystal 22 is placed on the top layer 21a.

It should be noted that the layers are stacked so that each of the layers does not have an excess surface area that is not seeded by a seed crystal or that is not in contact with the adjacent layer, whereby undesirable nucleation at that excess surface area is prevented.

Figure 5:
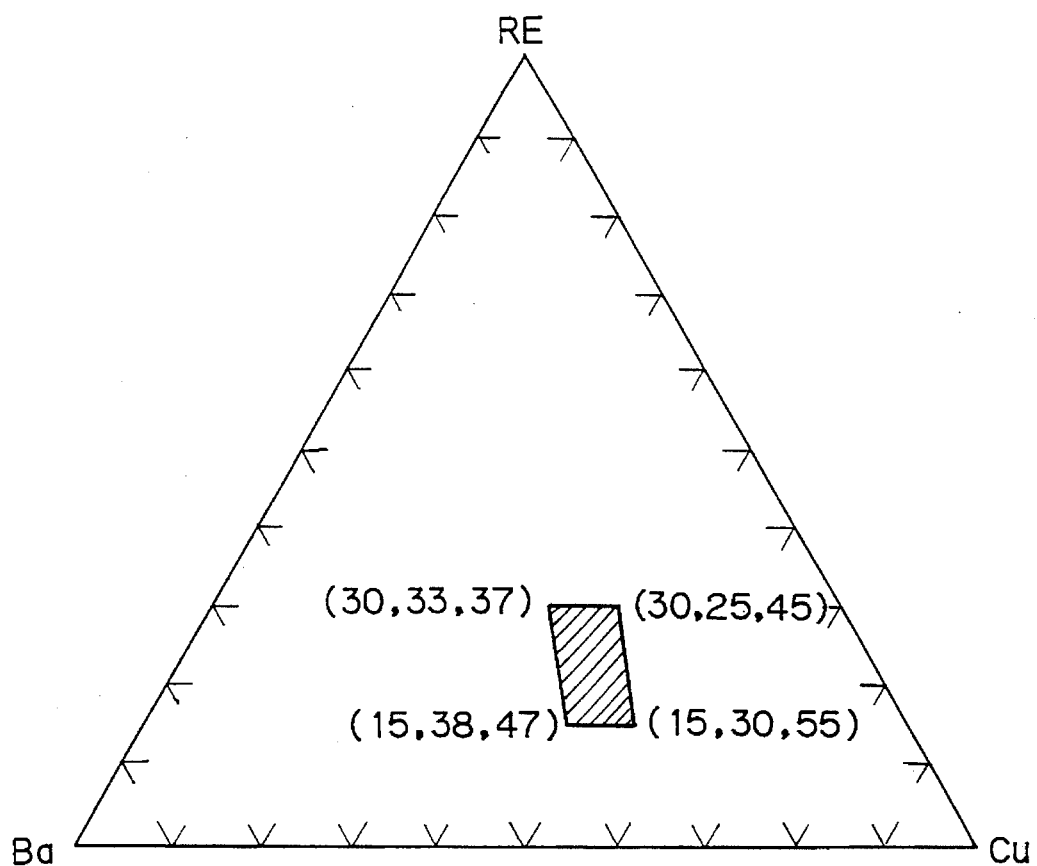
FIG. 5 shows the composition range of the starting material of the present invention.

For example, the shaped body as shown in FIG. 2 is prepared from oxides and/on complex oxide of RE, Ba and Cu where RE represents at least one element of Y, Sm, Eu, Gd, Dy, Ho, Er, Tm, Yb and Lu to have a composition of element ratios of (RE:Ba:Cu) in a region enclosed by linear lines connecting (30:33:37), (15:38:47), (15:30:55) and (30:25:45). The region of the composition is shown in FIG. 5. Further, at least one of 0.01–2.0% by weight of Rh and 0.05–5.0% by weight of Pt is added to the starting material. Such a mixture of powders is then formed into a shaped body; first the center layer 11a. Next, another mixture of powders having a composition within the above region (FIG. 5), except that the RE element or composition of RE elements is different from that of the first mixture, is prepared and formed over the center layer 11b to surround the same. Similar procedures as above may be optionally further repeated (at least once) and the shaped body M as shows in FIG. 2 is made.

Also, the shaped body M' as shown in FIG. 4 may be similarly made from the starting materials having compositions within the above region (FIG. 5) by forming a first layer having a first (123) phase formation temperature and a first size or length, forming a second layer having a second (123) phase formation temperature lower than the first temperature and a second size or length larger than the first size, and placing the first layer on the second layer and optionally repeating the similar procedure.

Figure 6:
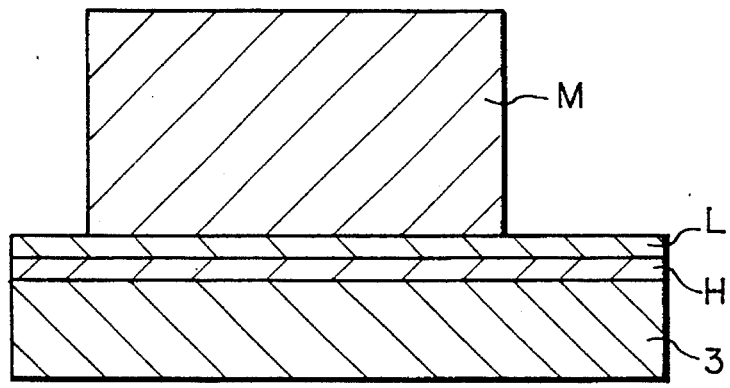
FIG. 6 shows a heat treatment of a shaped body of a starting material according to a process of the present invention.

The thus made shaped body M or M' is placed on a support as shown in FIG. 6. In FIG. 6, a shaped body H has an atomic ratio of metal elements of RE:Ba:Cu similar to that of the shaped body M or M' but has a (123) phase formation temperature higher than any of the (123) phase formation temperatures of the layers forming the shaped body M or M' and the shaped body L has an atomic ratio of metal elements of RE:Ba:Cu similar to that of the shaped body M or M' but has a (123) phase formation temperature lower than any of the (123) phase formation temperatures of the layers forming the shaped body M or M'. These shaped bodies are placed on the support 13 in the order of M or M' / L / H / support 13.

Then the shaped bodies on the support are heated to a temperature is a range from the highest (123) phase formation temperature (Tfh) among those of the layers of the shaped body M or M' to a (211) phase formation temperature (Td) of that layer so as to partially melt the shaped body M or M', followed by cooling to a temperature lower than the (123) phase formation temperature of a seed crystal to be used and higher than said Tfh and then seeding with a seed crystal. The shaped bodies are then further gradually cooled at a cooling rate of not more than 20° C./hr to a temperature lower than the lowest (123) phase formation temperature (Tfl) among those of the layers of the shaped body M or M' by at least 30° C., thereby resulting in the growth of a crystal. Then, successively or after cooling once to room temperature, the grown crystal is heat treated in an oxidizing atmosphere in a temperature range of 800° C. to 200° C. to add oxygen to the crystal and produce the x value of $REBa_2Cu_3O_{7-x}$ where x represents an insufficient amount of oxygen in comparison with the stoichiometric amount of 0.2 or less. The amount of insufficient oxygen amount x is estimated through a measurement of the critical temperature of the superconductor.

The composition of the starting material is made in a region of the (RE:Ba:Cu) element ratio enclosed by the linear lines connecting (30:33:37), (15:38:47), (15:30:55) and (30:25:45) because the ratios of Ba and Cu, which become liquid when the starting material is partially melted, is above said range, the flow of the liquid phase out of the shaped body may be excessive thereby causing the shaped body to remarkably shrink or lose its shape. If the ratio of RE, which forms a solid (211) phase when the starting material is partially melted, is above said range, the liquid phase becomes insufficient when (123) phase is growing and the growth crystal of the (123) phase may stop. While considering the above, since the upper limit of the (211) phase in the bulk was about 50% by volume when the (123) phase crystal was stably growing, the volume percent of (211) phase is made to be 50% by volume in the present invention.

In the present invention, the (123) phase crystal grows while taking the (211) phase in the crystal. The structure of the (123) phase is transformed from tetragonal system to orthorhombic system by oxygen annealing at around 600° C. Accompanied with the transformation, twin boundaries are formed in the (123) phase. Further, although the crystal of the (123) phase is grown from a single seed crystal, the grown crystal contains small angle grain boundaries inside the crystal. Thus, the bulk oxide superconductor crystal as grown in accordance with the above process is not the theoretically complete single crystal. Nevertheless, the bulk oxide superconductor crystal of the (123) phase of the present invention is referred to as a "single crystal" since it does not contain large angle grain boundaries, which exist in a sintered body and remarkably lowers the critical current, and it is a single crystalline body grown from a single crystal seed.

Additive elements Pt and/or Ph play the role of preventing the grain growth of a (211) phase in the partial melt state comprising a (211) phase and a Ba/Cu complex oxide, thereby suppressing the grain size of a (211) phase in the final structure to about 1 μm, which become the main pinning centers at around the critical temperature, resulting in a high critical current density. Specifically, when the (211) phases have a size of about 10 μm, the critical current density is 3000 to 5000 A/cm$^2$ at 77K and 1T. In contrast, when the (211) phases are finely dispersed and have a size of about 1 μm, the critical current density can be improved at 20,000 to 30,000 A/cm$^2$ at 77K and 1T.

However, the bulk oxide superconductor having even a relatively large size (e.g. 5 to 20 μm) of (211) phases may have a practical critical current density at a relatively low temperature, since the pinning centers called background pins caused by a (123) phase also contribute to an improvement of the critical current density at a temperature of less than about 65K. Accordingly, in the present invention, the size of (211) phases is made to be not more than 20 μm, and preferably not more than 2 μm.

If Pt and/or Ph are not added, the (211) phases grow to sizes of about 5 μm to 40 μm with a large size distribution. In contrast, when Pt and/or RH are added in an adequate amount, the (211) phases are finely dispersed in a single crystal of a (123) phase and have a size of about 1 μm or even 0.2 μm. The amount of Pt is made to be from 0.05% by weight at which the desired effect is obtained to 5.0% by weight at which a Pt/Ba complex oxide appears in the crystal. The amount of RH is made to be from 0.001% by weight at which the desired effect is obtained to 2.0% by weight at which a Rh/Ba complex oxide appears in the crystal. Since Pt and Rh are expensive, a smaller amount of addition thereof is preferred and thus 0.2 to 1.0 wt % of Pt and/or 0.01 to 0.2 wt % of Rh are preferred.

The starting material may comprise any of the oxides of RE, Ba and Cu and/or the complex oxides of RE, Ba and/or Cu. If the starting material contains a (211) phase powder, the particle size of the (211) phase powder should be sufficiently lowered, and if the particle size of the (211) phase powder is too large, the (211) phases are not finely dispersed in the final product.

The RE element contained in a single layer of a final body (M or M') wherein a crystal is continuous throughout all the layers and a single crystal is formed may comprise a single RE element or a plurality of RE elements. The (123) phase formation temperature (Tf) of $REBCu_3O_{7-x}$ is higher as the ion diameter of RE increases. Y has an ion diameter size between Dy and Ho. The (123) phase formation temperatures of various RE elements are shown in Table 1.

TABLE 1

| RE | Tf (°C.) | RE | Tf (°C.) |
|----|----------|----|----------|
| Y  | 1000     | Ho | 990      |
| Sm | 1060     | Er | 980      |
| Eu | 1050     | Tm | 960      |
| Gd | 1030     | Yb | 900      |
| Dy | 1010     | Lu | 880      |

When a plurality of RE elements are contained, the (123) phase formation temperature is almost equal to the molar average of the (123) phase formation temperatures for the respective RE elements. The (123) phase formation temperature of a crystal having a composition containing an $RE_1$ element in a mole ratio of $m_1$, an $RE_2$ element in a mole ratio of $m_2$, and so forth can be expressed by the following formula:

$$Tf[RE_1(m_1), RE_2(m_2) \ldots ]$$

$$=[Tf(RE_1)] \times m_1 + [Tf(RE_2)] \times m_2 + \ldots$$

However, Ce, Pr and Tb do not form a (123) phase if there is only one RE element contained and thus these elements are excluded. The La-system forms $(La_{1-x}Ba_x)_2CuO_4$ as the primary crystal and the Nd-system forms $Nd_{1-x}Ba_{2-x}Cu_3O_{7-x}$ as the primary crystal. Nevertheless, the addition of La and/or Nd to other RE systems plays the role of raising the (123) phase formation temperature.

The shaped body M or M' is then heated to a temperature above the highest (123) phase formation temperature among those of the layers of the shaped body to form a partial melt state comprising (211) phases and liquid phases entirely in the shaped body. The seeding is conducted by placing a seed crystal having a (123) phase formation temperature higher than said highest (123) phases formation temperature onto the layer having the highest (123) phase formation temperature, usually around the center thereof. The shaped body is then cooled to a temperature lower than the lowest (123) phase formation temperature among those of the layers of the shaped body by at lest about 30° C., thereby resulting in the growth of a crystal of the (123) phase wherein precipitates of a (211) phase are dispersed.

While the shaped body is heat treated, it is supported, and conventionally, platinum is used as the support, but since the liquid phase components in the partial melt state, i.e., Ba and Cu oxides, are extremely reactive, if the shaped body in the partial melt state is in contact with a Pt support for a long time, the liquid phase composition varies or contains impurity elements, thereby damaging the crystalinity or superconductor property.

In the present invention, the support is made of a (123) phase itself. Namely, between the shaped body M or M' and a support, another shaped body H of a (123) phase or a precursor thereof having a (123) phase formation temperature higher than any of the (123) phase formation temperatures of the layers of the shaped body M or M', and a further shaped body L of a (123) phase or a precursor thereof having a (123) phase formation temperature lower than any of the (123) phase formation temperatures of the layers of the shaped body, are inserted in order of the shaped body M or M' / shaped body L / shaped body H / support. The shaped bodies H and L act as a barrier. The shaped body H acts as a barrier to prevent a flow of the liquid phase of the shaped body M or M' to the support and the shaped body L acts as a barrier to prevent inhibition of crystal growth of the shaped body M by a (123) phase crystal grown in the shaped body H. If the (123) phase of the layer of the shaped body M or M' closest to the shaped body H acts similarly to the barrier of the shaped body L, the shaped body L may be eliminated. By the above barrier, the single crystal (of the (1,2,3) phase is effectively grown.

The crystal as grown above is cubic in crystal structure, which is then converted to a rhombic crystal structure by cooling in an oxidizing atmosphere from 800° C. to 200° C. so as to absorb oxygen, and thus a superconductor is obtained. Thus, a single crystal bulk oxide superconductor exhibiting a microstructure wherein precipitates of a (211) phase are dispersed in a single crystal of a (123) phase is obtained and the single crystal of the (1,2,3) phase referred to herewith means a crystal grown from a single seed not containing large gradient angle grain boundaries, which prevent the superconducting current. Please note however that the crystal may contain many small angle grain boundaries (less than 20°).

EXAMPLES

EXAMPLE 1

$RE_2O_3$ (RE is Dy, Ho or Er), CuO and $BaCuO_2$ were mixed in a composition having a molecular ratio of RE:Ba:Cu of 11:19:28 and Pt was further added in an amount of 0.5% by weight based on the total weight of the mixture. First, a powder mixture of $Dy_2O_3$, CuO, $BaCuO_2$ and Pt was unidirectionally molded to a first shaped body having a diameter of 20 mm and a thickness of 10 mm. The obtained first shaped body was placed in a mold, a powder mixture of $Ho_2O_3$, CuO, $BaCuO_2$ and Pt was placed in the same mold over the first shaped body, and a unidirectional molding was effected to form a second shaped body having a diameter of 35 mm and a thickness of 18 mm. Further, a similar procedure was repeated using a powder mixture of $Er_2O_3$, CuO, $BaCuO_2$ and Pt and a third shaped body M having a diameter of 50 mm and a thickness of 25 mm, as shown in FIG. 2, was obtained.

Powders of $Yb_2O_3$, $BaO_2$ and CuO in ratio of Sm:Ba:Cu of 13:17:24 were mixed and about 16 g of the mixed powders were placed in a platinum crucible and fused in a furnace at a temperature of 1400° C. for 8 minutes. The fused oxides were poured onto a copper plate and pressed with another copper plate to form a shaped body H having a thickness of about 1.5 mm. Using the same materials and procedure as above, except that $Sm_2O_3$ was replaced by $Yb_2O_3$, a shaped body L was formed. The shaped body M was placed on a Pt support with the shaped body L and the shaped body H inserted therebetween (FIG. 6).

The shaped body M was heated to 1150° C. in 2 hours, kept at 1150° C. for 30 minutes and cooled to 1030° C. 1030° C. seeding was effected with a seed crystal of $SmBa_2Cu_3O_{7-x}$ (123) phase. This seed crystal was prepared by mixing $Sm_2O_3$, $BaO_2$ and CuO in a ratio of Sm:Ba:Cu of 13:17:24 and adding thereto Pt in an amount of 0.5% by weight. The powder mixture was heated to 1150° C. in 5 hours and gradually cooled in an atmosphere from 1070° C. to 1050° C. in 30 hours to obtain an assembly of crystals each having a size of about 1 cm$^3$. A single crystal of about 5 mm cubic was cut from said assembly and used as the seed crystal.

After seeding, the shaped body was gradually cooled from 1020° C. to 940° C. at an average temperature lowering rate of 0.5° C./hr to grow a crystal. The crystal of the (1,2,3) phase was then cooled to room temperature.

The crystal of the (1,2,3) phase was subject to an oxygen addition treatment by heating it to 800° C. and gradually cooling in an oxygen flow to 200° C. in 150 hours. Thus, a single crystal of a bulk superconductor was obtained.

Figure 7A:
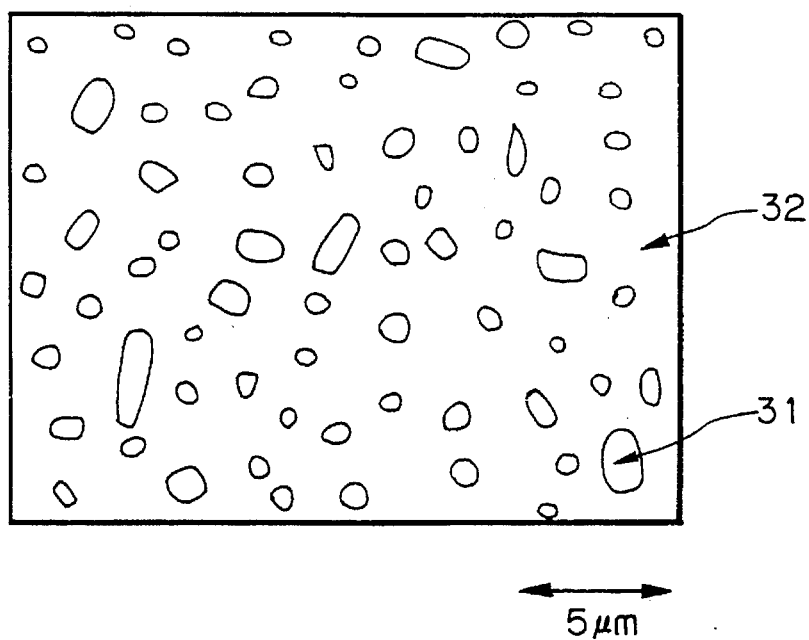
FIGS. 7A and 7B show the microstructures of the bulk crystal observed through a microscope.
Figure 7B:
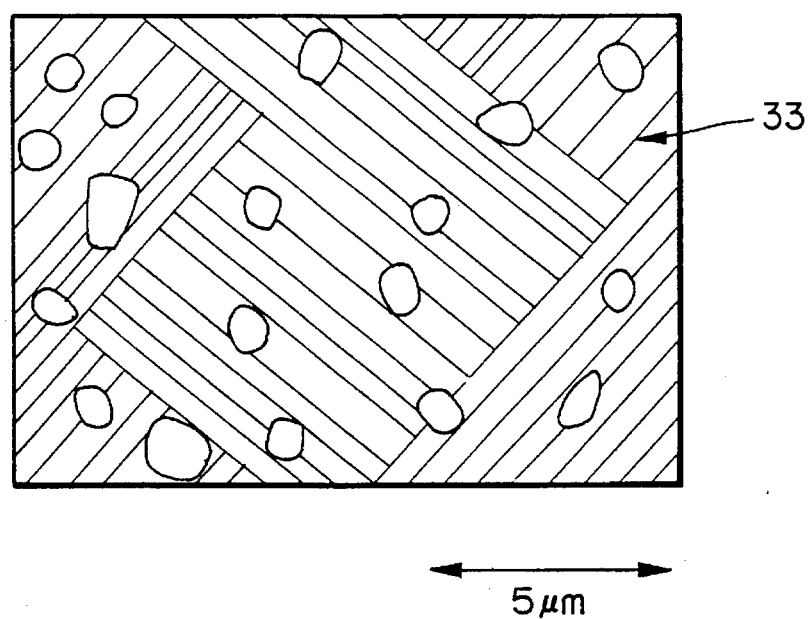

The obtained material was mirror polished and observed through an optical microscope (see FIGS. 7A and 7B). As shown in FIG. 7A, most (211) phases 31 have a particle size of 0.5 μm to 2 μm and are dispersed in (123) phase 32 in a volume percent of about 20 to 25%. In FIG. 7B, the crystal orientation of the bulk crystal (shaped body M) was examined by observing the twin 33 appearing in the bulk crystal and the shaped body L and it was found that the crystal orientation of the bulk crystal in a region adjacent to the shaped body L has approximately the same orientation as that of the seed crystal (the orientation of c-axis of the bulk crystal is aligned with that of the seed crystal within ± about 20 degrees). Thus, it was confirmed that the bulk crystal was a single crystal.

Figure 8:
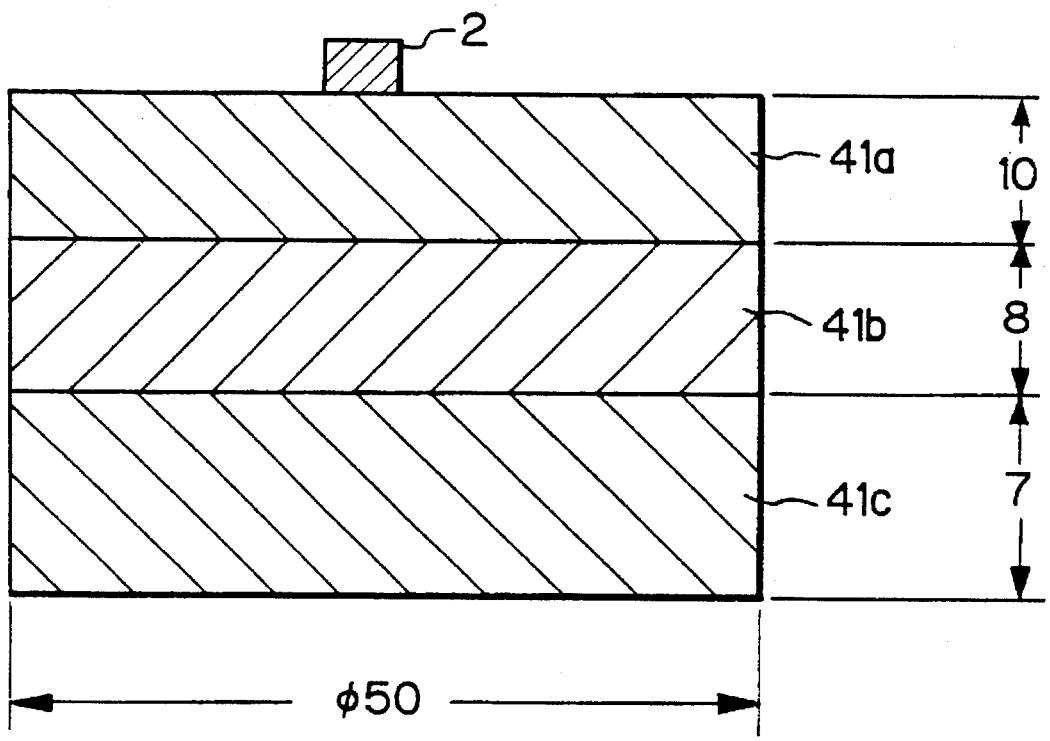
FIG. 8 shows the structure of a shaped body of a starting material in a Comparative Example.

As a comparison, a shaped body was prepared in the form as shown in FIG. 8 from the starting materials used for the above Example 1. In FIG. 8, the top layer 41a had a thickness of 10 mm, the layer 41b had a thickness of 8 mm and the bottom layer 41c had a thickness of 7 mm, and all layers 41a, 41b and 41c had a diameter of 50 mm.

Using the same procedure as in Example 1, the shaped body was heated, seeded, crystallized and oxygen annealed.

The obtained product was not a single crystal, and at a portion of the top layer 41a remote from the seed crystal 42, nucleation occurred and the resultant product comprised two crystal grains.

EXAMPLES 2 TO 6

Using the starting materials as shown in Table 2 and the procedure used in Example 1, shaped bodies were prepared and crystal growth thereof were effected to form a shaped body as shown in FIG. 4, each of the layers was formed and simply stacked.

The obtained bulk superconductors were very similar to that of Example 1.

TABLE 2

| Ex. No. | RE Composition | Starting material | RE:Ba:Ca | Additive | Shaped body |
|---|---|---|---|---|---|
| 1 | Y:Yb = 100:0 90:10 80:20 | $BaCuO_2$ CuO $RE_2BaCuO_5$ (particle size of about 1.5 μm) | 13:17:24 | 0.1 wt % Rh | FIG. 2 |
| 2 | Y Ho Er | $RE_2O_3$ $BaO_2$ CuO | 17:37:46 | 0.05 wt % Rh | FIG. 3 |
| 3 | Y:Er = 100:0 50:50 0:100 | $RE_2BaCuO_5$ (particle size of about 1.5 μm) $BaO_2$ CuO | 28:34:38 | 0.01 wt % Rh 0.1 wt % Pt | FIG. 3 |
| 4 | Dy:Ho:Er = 100:0:0 50:50:0 0:100:0 0:50:50 0:0:100 | $RE_2O_3$ $BaCuO_3$ CuO | 13:17:27 | 0.2 wt % Pt 0.05 wt % Rh | FIG. 4 |
| 5 | Y:Yb = 100:0 90:10 80:20 70:30 60:40 | $RE_2BaCuO_5$ (particle size of about 1.5 μm) $BaCuO_2$ CuO | 14:17:26 | 0.5 wt % Pt | FIG. 4 |

I claim:

1. An oxide superconducting material exhibiting a microstructure wherein precipitates of a $RE_2BaCuO_5$ (211) phase are dispersed in a single crystal of a $REBa_2Cu_3O_{7-x}$ (123) phase where RE represents at least one element; selected from a group consisting of Y, Sm, Eu, Gd, Dy, Ho, Er. Tm, Yb and Lu; said single crystal comprising an inner layer surrounded by successive three dimensional layers, said successive three dimensional layers being concentric and extending outward from said inner layer; each of said layers comprising an RE element or a composition of RE elements different from those of the other layers; said layers being located in an order such that the (123) phase formation temperature of said layers are successively lowered from the inner layer outward.

2. A bulk oxide superconductor according to claim 1 wherein said (211) phases are present in an amount of not more than 50% by volume of the total oxide phases and not less than 95%, in number of particles, of said (211) phases having a particle size of not more than 20 μm.

3. A bulk oxide superconductor according to claim 2 wherein said (211) phases are present in an amount of not more than 50% by volume of the total oxide phases and not less than 95%, in number or particles, of said (211) phases having a particle size of not more than 2 μm.

4. A bulk oxide superconductor according to claim 1 wherein said single crystal further contains at least one of 0.001–2.0% by weight of Rh and 0.05–5.0% by weight of Pt.

5. An oxide superconducting material exhibiting a microstructure wherein precipitates of a $RE_2BaCuO_5$ (211) phase are dispersed in a single crystal of a $REBa_2Cu_3O_{7-x}$ (123) phase where RE represents at least one element selected from a group consisting of Y, Sm, Eu, Gd, Dy, Ho, Er, Tm, Yb and Lu; said single crystal being composed of a stack of layers; said stack having a longitudinal axis; each of said layers comprising an RE element or a composition of RE elements different from those of the other layers; said layers having respective (123) phase formation temperatures that are successively lowered in the longitudinal axis direction of said stack; said layers being perpendicular to the longitudinal axis of said stack, said layers having lengths perpendicular to the longitudinal axis of said stack, which lengths are successively elongated as the (123) phase formation temperature of the layers are lowered.

6. A bulk oxide superconductor according to claim 5 wherein said (211) phases are present in an amount of not more than 50% by volume of the total oxide phases and not less than 95%, in number of particles, of said (211) phases having a particle size of not more than 20 μm.

7. A bulk oxide superconductor according to claim 6 wherein said (211) phases are present in an amount of not more than 50% by volume of the total oxide phases and not less than 95%, in number of particles, of said (211) phases having a particle size of not more than 2 μm.

8. A bulk oxide superconductor according to claim 5 wherein said single crystal further contains at least one of 0.001–2.0% by weight of Rh and 0.05–5.0% by weight of Pt.

* * * * *